United States Patent [19]
Keeth

[11] Patent Number: 5,519,360
[45] Date of Patent: May 21, 1996

[54] RING OSCILLATOR ENABLE CIRCUIT WITH IMMEDIATE SHUTDOWN

[75] Inventor: Brent Keeth, Boise, Id.

[73] Assignee: Micron Technology, Inc., Boise, Id.

[21] Appl. No.: 506,216

[22] Filed: Jul. 24, 1995

[51] Int. Cl.⁶ .................. H03B 5/24; H03L 3/00
[52] U.S. Cl. ............ 331/57; 331/173; 327/534
[58] Field of Search ................ 331/45, 57, 111, 331/143, 172, 173; 327/534–537

[56] References Cited

U.S. PATENT DOCUMENTS

| | | | |
|---|---|---|---|
| 3,319,078 | 5/1967 | Dunnet et al. | 331/173 X |
| 4,344,003 | 8/1982 | Harmon et al. | 331/57 X |
| 4,471,290 | 9/1984 | Yamaguchi | 331/57 X |
| 5,023,465 | 6/1991 | Douglas et al. | 365/203 |
| 5,038,325 | 8/1991 | Douglas et al. | 365/189.06 |
| 5,039,877 | 8/1991 | Chern | 307/296.2 |
| 5,126,590 | 6/1992 | Chern | 307/296.2 |
| 5,182,529 | 1/1993 | Chern | 331/57 |
| 5,311,476 | 5/1994 | Kajimoto et al. | 331/57 X |
| 5,345,186 | 9/1994 | Lesmeister | 331/57 X |
| 5,355,097 | 10/1994 | Scott et al. | 331/173 X |
| 5,396,114 | 3/1995 | Lee et al. | 327/535 |

FOREIGN PATENT DOCUMENTS

| 1033013 | 2/1986 | Japan | 331/57 |
|---|---|---|---|

*Primary Examiner*—David Mis
*Attorney, Agent, or Firm*—Schwegman, Lundberg, Woessner & Kluth

[57] ABSTRACT

An integrated memory circuit is described which includes a charge pump for producing a pumped voltage and a ring oscillator coupled to the charge pump. The ring oscillator is used to operate the charge pump, such that pump cycles are activated on the edges of the oscillator output. The ring oscillator includes an oscillator enable circuit which is controlled by a regulator to maintain a controlled pump voltage. The oscillator enable circuit immediately shuts the ring oscillator off when the pump voltage reaches a predetermined upper voltage limit so that additional oscillator cycles are eliminated, thereby, reducing the chance of an overshoot in the pump voltage. The oscillator enable circuit turns the oscillator on when the pump voltage decreases to a predetermined lower level.

11 Claims, 4 Drawing Sheets

5,519,360

RING OSCILLATOR ENABLE CIRCUIT WITH IMMEDIATE SHUTDOWN

TECHNICAL FIELD OF THE INVENTION

The present invention relates generally to integrated circuits and in particular the present invention relates to ring oscillator circuits. More particularly, the present invention relates to a ring oscillator enable circuit.

BACKGROUND OF THE INVENTION

Charge pumps are well known in the art as an on-chip voltage regulator capable of providing a voltage more positive than the most positive external power supply voltage and/or negative voltage in the absence of a negative power supply voltage. The pump voltage is provided by a charge stored on a charge capacitor. The advantages of charge pumps are also well known in the art, for example, such as providing a bias voltage for the substrate of an integrated circuit or n-type and p-type wells, or for providing greater output voltage swings.

Many types of integrated circuit memories require several different power levels for operation. Some of these power levels exceed the available potential range of the external power supplies used to power the circuit. For example, access transistors connected to dynamic memory cells typically use a pumped voltage (Vccp) to drive their gates above the most positive power supply voltage. The Vccp is typically provided by a charge pump and is used to allow a complete charge to be written to the memory cell. If a lower voltage were used as the gate potential, such as the supply voltage Vcc, a threshold voltage (Vt) would be lost between the source and drain, such that a full source voltage could not reach the drain.

Most charge pumps provide some type of oscillator circuit. This circuit can be a ring oscillator which provides a square wave or pulse train having voltage swings typically between ground and the most positive external supply voltage, Vcc. The pumped voltage level is partially controlled by the ring oscillator. That is, the pumped charge is generated when the ring oscillator cycles high. The ring oscillator, therefore, has an active half-cycle and an inactive half-cycle. A charge capacitor is typically pre-charged during the inactive half-cycle. The capacitor charge is then pumped to a higher level by charge sharing with another capacitor when the ring oscillator transitions to the active half-cycle. To reduce the amount of inactive time, charge pumps can have more than one phase where each phase operates on either the high or low transition of the ring oscillator.

Typical ring oscillators include an enable circuit which is used in the regulation of the pumped voltage. The enable circuit activates and deactivates the ring oscillator when the pumped voltage exceeds pre-determined upper and lower limits. When the charge capacitor has been discharged to a point where the lower level of Vccp has been reached, a regulator circuit activates an enable circuit coupled to the ring oscillator and the charge capacitor is re-charged. When the charge on the capacitor reaches the desired upper limit the oscillator is disabled. This process maintains an acceptable level for Vccp.

A problem occurs when the oscillator fails to turn-off when the enable circuit is triggered. Over-shoot of the charge pump maybe experienced when the oscillator completes an additional cycle after the disable signal is received. This over-shoot makes regulation of the pump voltage difficult and increases the peak to peak ripple experienced in Vccp.

For the reasons stated above, and for other reasons stated below which will become apparent to those skilled in the art upon reading and understanding the present specification, there is a need in the art for a ring oscillator enable circuit which shuts down the ring oscillator immediately to allow for better regulation of Vccp.

SUMMARY OF THE INVENTION

The above mentioned problems with ring oscillators and other problems are addressed by the present invention and which will be understood by reading and studying the following specification. A ring oscillator enable circuit is described which immediately shuts the ring oscillator off to avoid over-shoot.

In particular, the present invention describes an integrated circuit comprising a ring oscillator having cascaded inverting stages connected in a ring for producing an oscillating output having rising and falling transitions. An enable/disable circuit is coupled to the ring oscillator and has an input signal. The enable/disable circuit is responsive to the input signal for disabling the ring oscillator and prohibiting additional rising and falling transitions. The enable/disable circuit can comprise a feed forward circuit responsive to the input signal, and a feed back circuit responsive to the input signal.

In an alternate embodiment, the oscillating output is provided as the output from one of the plurality of cascaded inverting stages, and a feed forward circuit is comprised of a multiplexer located between the input of the one of the plurality of cascaded inverting stages and an output of a preceding cascaded inverting stage of the ring oscillator. A feed back circuit is comprised of a multiplexer and a feed back inverter connected between the output of the one of the plurality of cascaded inverting stages and the input of the one of the plurality of cascaded inverting stages.

The integrated circuit can include a charge pump circuit coupled to the ring oscillator for producing a pumped voltage, or a voltage regulator circuit for generating the input signal.

In another alternate embodiment a method is provided for controlling a ring oscillator. The method comprises the steps of providing a ring oscillator having cascaded inverting stages formed in a ring for producing an oscillating output having rising and falling transitions, providing an input signal to an enable/disable circuit coupled to the ring oscillator, and disabling the ring oscillator in response to the input signal, such that additional rising and falling transitions are prohibited.

DETAILED DESCRIPTION OF THE INVENTION

In the following detailed description of the invention, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
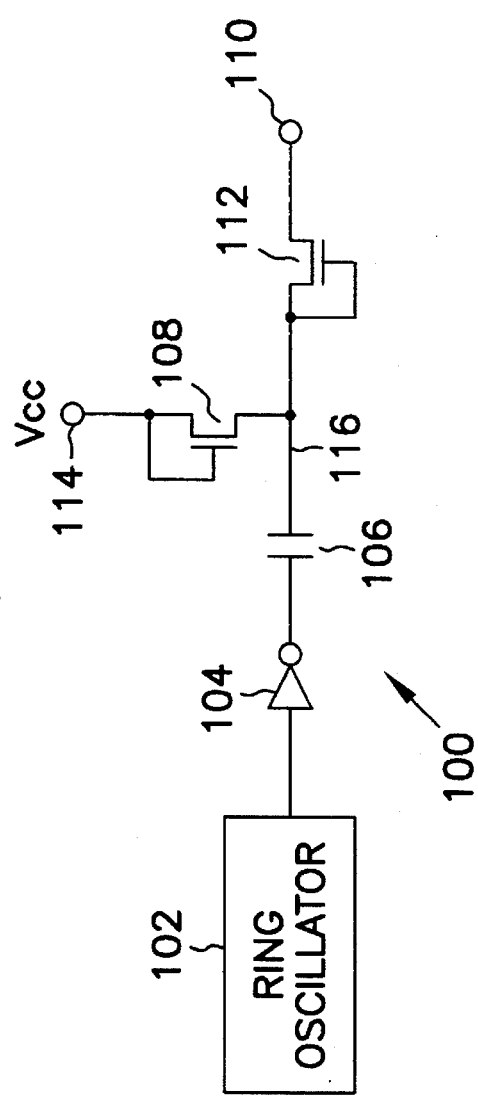
FIG. 1 is a prior art charge pump.

A basic single phase charge pump 100 is described with reference to FIG. 1. A ring oscillator 102 provides a square wave oscillating signal having voltage swings between the supply voltage, Vcc, and ground. An inverter 104 may be used to sharpen the edges of the oscillating output signal of the ring oscillator. A capacitor 106 is discharged through the output 110 via diode connected transistor 112. Transistor 108 is coupled to the external power supply voltage, Vcc, at terminal 114. When the ring oscillator 102 produces a voltage close to Vcc, the output of inverter 104 is low and circuit node 116 is approximately at the voltage of the power supply minus a threshold voltage (Vcc-Vt) as provided by transistor 108. When the ring oscillator transitions to a low voltage, the output of inverter 104 goes high and boosts the charge on capacitor 106. The incremental charge on capacitor 106 is delivered to output 110 through transistor 112. The charge on capacitor 106 is therefore pumped above Vcc to produce Vccp. It is understood that multiple-phase charge pumps can be operated using a single ring oscillator, as known to one skilled in the art. Further, any charge pump design can be used with the present invention and the charge pump described herein is not intended to limit the present invention.

Figure 2:
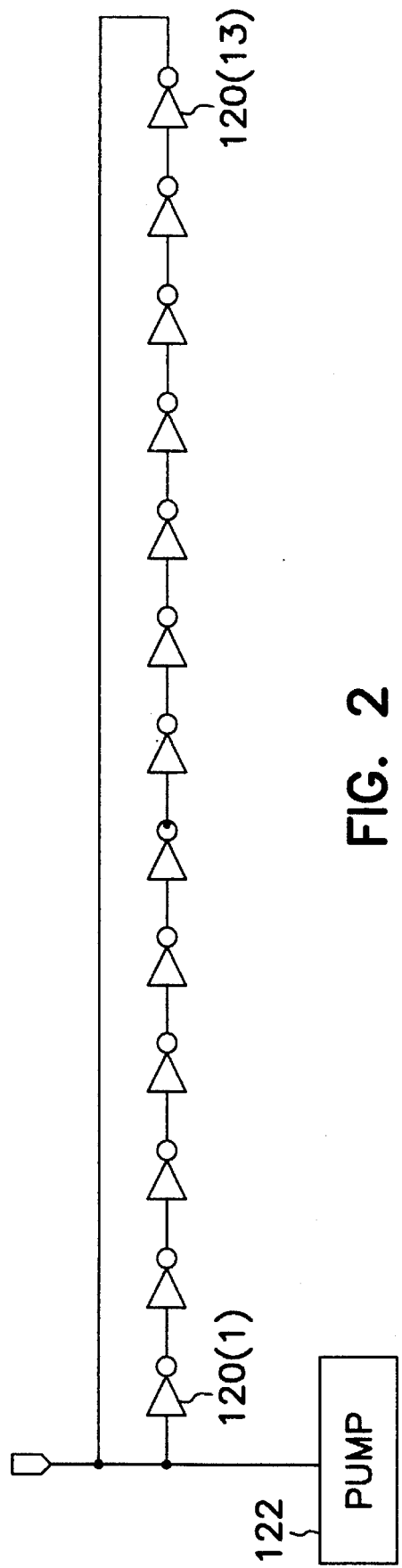
FIG. 2 is a art ring oscillator.

A typical ring oscillator is shown in FIG. 2 and includes an odd number of inverter stages 120(1)–(13) arranged in a serially connecting ring fashion. Thirteen inverter stages are shown in FIG. 2, but the exact number can be any odd number depending upon the delay through each stage and the desired oscillating frequency. The output of each inverter is coupled to the input of the succeeding inverter in the ring. The output of the last inverter 120(13) is coupled to the input of the first inverter 120(1) and forms the oscillating output. The output is coupled to the input of a two phase Vccp charge pump 122. That is, one phase is operated on a rising edge of the ring oscillator output and the other phase is operated on the falling edge.

Figure 3:
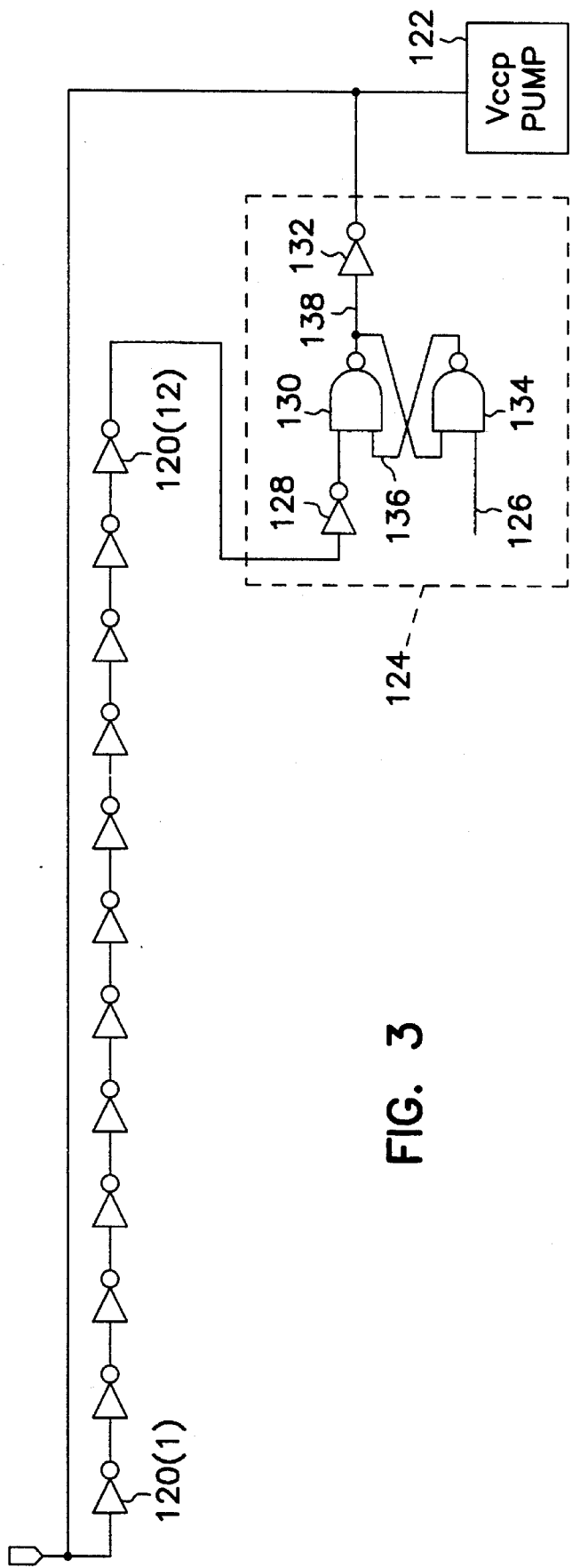
FIG. 3 is a ring oscillator including an enable circuit.

One of the inverter stages of the ring oscillator of FIG. 2 can be replaced with an enable circuit 124, as shown in FIG. 3. The enable circuit is a pair of cross-coupled NAND gates which form a latch when the ring oscillator is to be disabled. The enable circuit operates as an inverter when the Disable input 126 is low. That is, inverter 128, NAND gate 130 and inverter 132 together act as an inverter when the input 136 of NAND gate 130 is high. To disable the ring oscillator, the Disable input 126 is pulled high. The output of NAND gate 134 will latch low when the output 138 of NAND gate 130 goes high.

Figure 4:
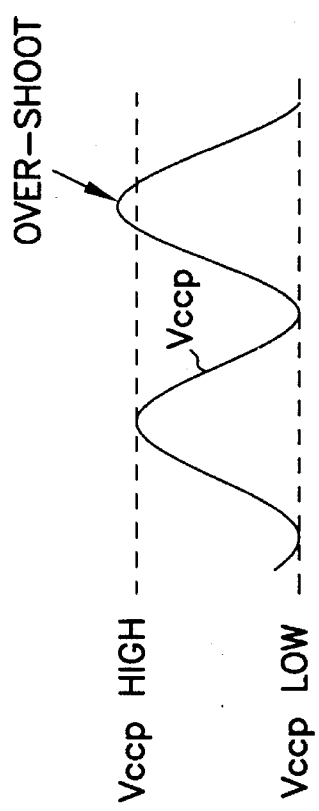
FIG. 4 is a graph of the Vccp output from a charge pump using the ring oscillator of FIG. 3.

The Disable input 126 is controlled by a regulator circuit (not shown) which monitors the Vccp voltage level. If the Vccp voltage reaches a pre-determined Vccp low level, the ring oscillator is enabled to activate the charge pump, see FIG. 4. If, on the other hand, the Vccp reaches a predetermined Vccp high level, the ring oscillator is disabled. If the Vccp pump does not turn off when the Disable input 126 goes high, an over-shoot in the Vccp level will occur. As stated above, the variation in the peak to peak ripple of the Vccp level resulting from over-shoot is undesirable.

An over-shoot in the Vccp pump 122 can happen if the Disable input 126 is pulled high shortly after the output of inverter 128 has gone high. For example, if the output from inverter stage 120(12) goes low, the output from the enable circuit 124 goes high. This produces a rising edge and allows one phase of the Vccp pump to charge its pump capacitor. If the Disable input goes high while the output from inverter 120(12) is low, the cross coupled NAND gates 130 and 134 cannot latch node 138 high. The output from inverter 120(12) must go high before NAND gate 134 can latch the output of NAND gate 130 to high state. This allows one low transition to occur on the oscillator output which triggers the other phase of the Vccp charge pump. To eliminate this extra cycle, an enable circuit is provided which stops the ring oscillator independent of the state of the oscillator, see FIG. 5.

Figure 5:
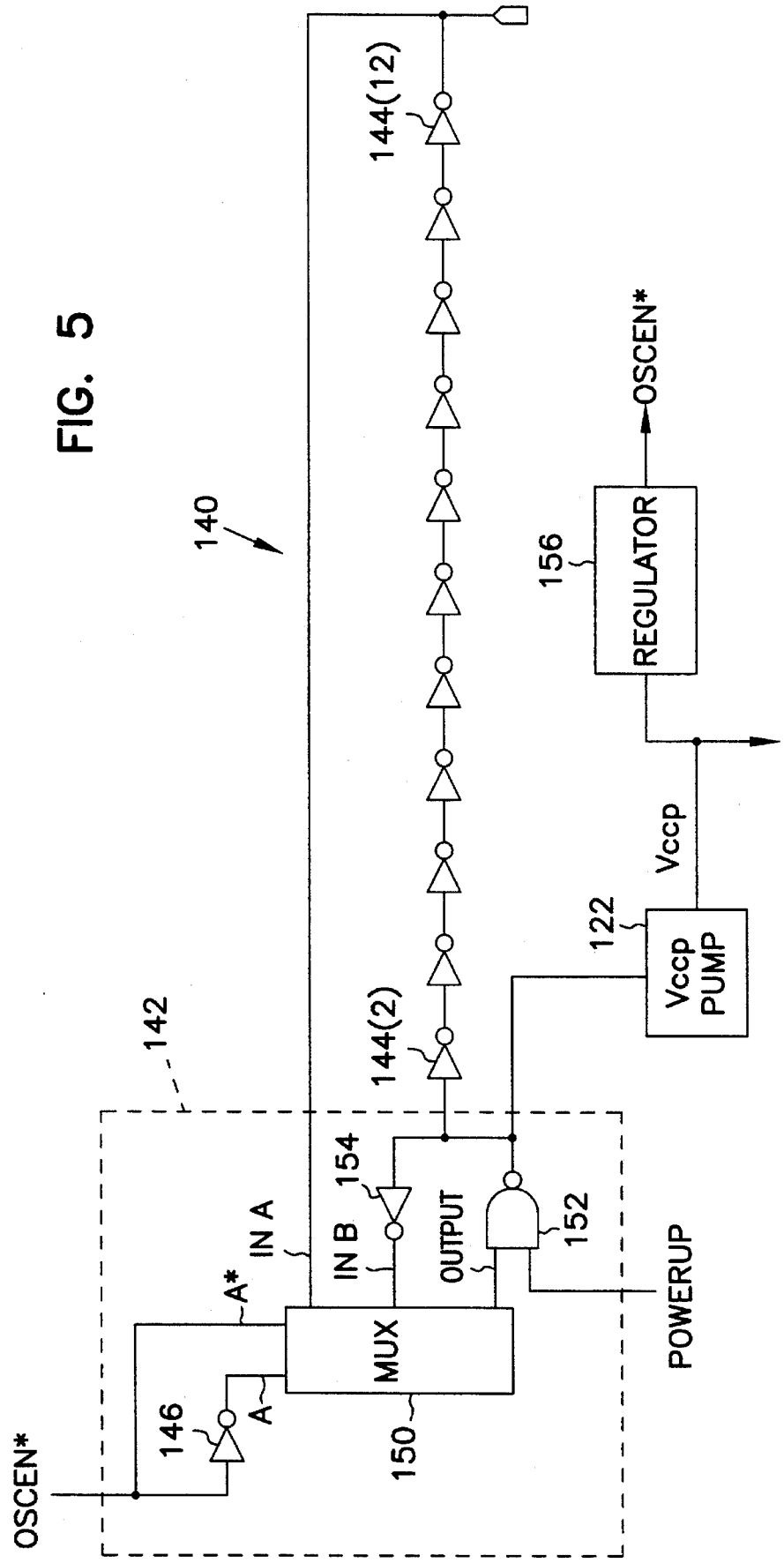
FIG. 5 is a ring oscillator incorporating the present invention.

A ring oscillator 140 is shown in FIG. 5 which includes an oscillator enable circuit 142 which insures that the output of the ring oscillator shuts down immediately upon notification by a regulator circuit. The ring oscillator is a series of cascading inverters 144(2)–(12). The output of each inverter is coupled to the input of the succeeding inverter in the ring. The output of the last inverter 144(12) is coupled to the oscillator enable circuit 142 which normally acts as an inverter element. The oscillator enable circuit 142 is then coupled to the input of a multiphase Vccp charge pump 122.

The oscillator enable circuit 142 includes an enable input (Oscen*) which is an inverse logic signal provided by voltage regulator 156. The voltage regulator monitors the Vccp voltage level provided by the Vccp pump 122 and controls the Oscen* signal as Vccp reaches its predetermined limit levels. The oscillator enable circuit 142 has a feed forward circuit including multiplexer 150 and NAND gate 152, and a feed back circuit including inverter 154 and multiplexer 150. Inverter 146 is provided to produce the complement, or inverse, of the Oscen* input signal. Both Oscen* and its complement are used to control multiplexer 150.

During normal oscillator operation, the Oscen* input is low (control input A*). The output of inverter 146 (control input A) is therefore high and multiplexer 150 couples the output of inverter stage 144(12) (Input A) to NAND gate 152 via the multiplexer output. The Powerup input to NAND gate 152 is normally high, as explained below. NAND gate 152, thereby, operates as an inverter stage in the ring oscillator.

The Oscen* input is pulled high by regulator 156 to turn the ring oscillator 140 off. When Oscen* goes high the output of inverter 146 goes low and multiplexer 150 couples the output of inverter 154 (Input B) to NAND gate 152. The NAND gate is, therefore, latched at its current state such that the oscillator is immediately disabled and cannot continue to cycle. It will be understood that the multiplexer 150 can be replaced with logic circuitry which responds to the Oscen* signal to selectively couple either the feedback circuit or the feed forward circuit to the next inverter stage.

Figure 6:
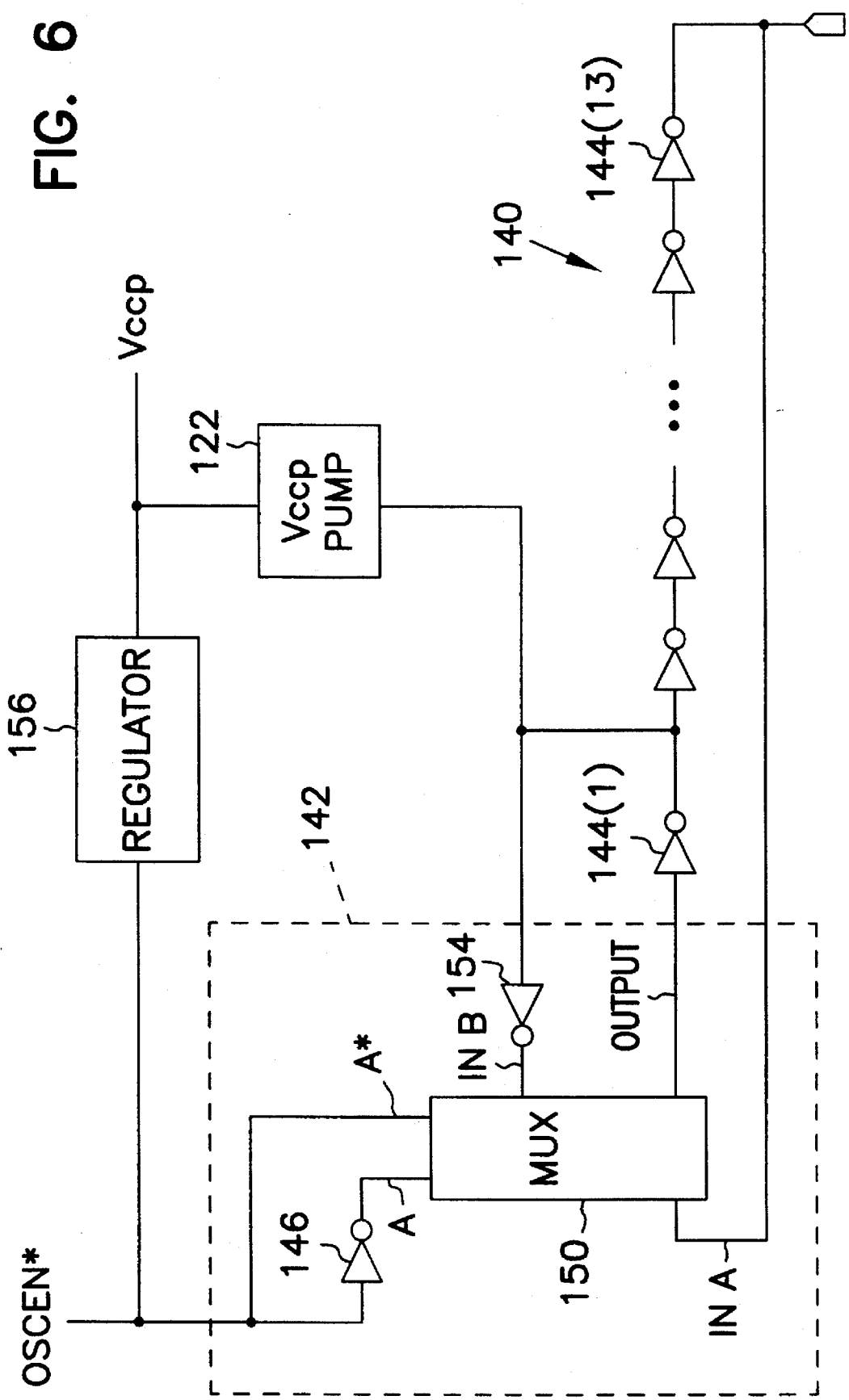
FIG. 6 is an alternate ring oscillator incorporating the present invention.

During a power-up sequence for the integrated circuit, the Powerup input to NAND gate 152 is held low so that the NAND gate output is latched high until the integrated circuit has been sufficiently powered-up. It will be recognized that NAND gate 152 can be replaced with a NOR gate having an increase logic power-up input, or an inverter if the power-up control is not desired. For example, FIG. 6 illustrates a ring oscillator 140 which has thirteen inverter stages 144(1)–(13). The oscillator enable circuit 142 uses the output of inverter stage 144(1) as the input for the feed back circuit, as defined by inverter 154 and multiplexer 150. The feed forward circuit, multiplexer 150, receives the output from inverter 144(13) and feeds the signal to inverter 144(1) when Oscen* is low. As explained above, when Oscen* goes high, inverter 144(1) is latched at its current state using the feed back circuit to disable the ring oscillator and prohibit further oscillations.

The present invention has been described in a ring oscillator having a series of inverting stages with the oscillator enable circuit 142 being coupled to the first inverting stage. It will be understood that any odd number of inverting stages can be used and that the oscillator enable circuit 142 can be located between any of the inverting stages. Although inverters are preferred as inverting stages in the ring oscillator, it will be under stood by those skilled in the art that any inverting-type circuit can be used, including but not limited to NAND and NOR gates. Further, the Vccp pump coupled to the ring oscillator can be any design and is not limited to a multi-phase charge pump.

Conclusion

A ring oscillator has been described for use with a charge pump circuit. The ring oscillator includes an oscillator enable circuit which is controlled by a regulator to maintain a controlled pump voltage. The oscillator enable circuit is not dependent upon the state of the ring oscillator and can immediately disable the oscillator. Additional oscillator cycles are eliminated, thereby, reducing the chance of an over-shoot in the pump voltage. When the pump voltage decreases to a predetermined lower level, the regulator activates the ring oscillator enable circuit. When activated, the enable circuit feed forward circuit can operate as an inverter stage in the ring oscillator. When the pump voltage increases to a predetermined upper level, the regulator de-activates the enable circuit. When de-activated, a feed back circuit latches an inverter stage of the ring oscillator.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, although the oscillator enable circuit has been described using a multiplexer to selectively couple either a feed back circuit or a feed forward circuit to the ring oscillator, a logic circuit could be used to perform the selective coupling operation. Therefore, it is manifestly intended that this invention be limited only by the claims and the equivalents thereof.

What is claimed is:

1. An integrated circuit comprising:

a ring oscillator having a plurality of cascaded inverting stages connected in a ring for producing an oscillating output having rising and falling transitions; and an enable/disable circuit coupled to the ring oscillator and having an input signal, the enable/disable circuit being responsive to the input signal for disabling the ring oscillator and prohibiting additional rising and falling transitions.

2. The integrated circuit of claim 1 wherein the enable/disable circuit comprises:

a feed forward circuit responsive to the input signal; and a feed back circuit responsive to the input signal.

3. The integrated circuit of claim 2 wherein:

the oscillating output is provided as the output from one of the plurality of cascaded inverting stages;

the feed forward circuit is comprised of a multiplexer located between the input of the one of the plurality of cascaded inverting stages and an output of a preceding cascaded inverting stage of the ring oscillator; and the feed back circuit is comprised of the multiplexer and a feed back inverter connected between the output of the one of the plurality of cascaded inverting stages and the input of the one of the plurality of cascaded inverting stages.

4. The integrated circuit of claim 1 further including a charge pump circuit coupled to the ring oscillator for producing a pumped voltage.

5. The integrated circuit of claim 1 further including a voltage regulator circuit for generating the input signal.

6. The integrated circuit of claim 1 wherein the plurality of inverting stages are comprised of a plurality of inverters.

7. An integrated circuit comprising:

a ring oscillator having a plurality of cascaded inverting stages formed in a ring for producing an oscillating output having rising and falling transitions;

one of the plurality of inverting stages being formed as an enable/disable circuit, having an input signal, and being responsive to the input signal for disabling the ring oscillator and prohibiting additional rising and falling transitions;

the enable/disable circuit comprising a feed forward circuit connected to an output of a preceding inverting stage and an input of a succeeding inverting stage, and a feed back circuit;

a charge pump connected to the ring oscillator; and a voltage regulator coupled to the charge pump for generating the input signal.

8. The integrated circuit of claim 7 wherein:

the feed forward circuit comprises a multiplexer connected to one input of a NAND gate;

the multiplexer being connected to the output of the preceding inverting stage and the NAND gate being connected to the input of the succeeding inverting stage; and the feed back circuit comprising an inverter connected to the input of the succeeding inverting stage and coupled to the multiplexer.

9. The integrated circuit of claim 7 wherein:

the feed forward circuit comprises a multiplexer connected to one input of a NOR gate;

the multiplexer being connected to the output of the preceding inverting stage and the NOR gate being connected to the input of the succeeding inverting stage; and the feed back circuit comprising an inverter connected to the input of the succeeding inverting stage and coupled to the multiplexer.

10. The integrated circuit of claim 7 wherein:

the feed forward circuit comprises a multiplexer connected to an input of an inverter gate;

the multiplexer being connected to the output of the preceding inverting stage and the inverter gate being connected to the input of the succeeding inverting stage; and the feed back circuit comprising an inverter connected to the input of the succeeding inverting stage and coupled to the multiplexer.

11. A method of controlling a ring oscillator, the method comprising the steps of:

providing a ring oscillator having a plurality of cascaded inverting stages formed in a ring for producing an oscillating output having rising and falling transitions;

providing an input signal to an enable/disable circuit coupled to the ring oscillator; and disabling the ring oscillator in response to the input signal, such that additional rising and falling transitions are prohibited.

\* \* \* \* \*